United States Patent
Tohlen et al.

(10) Patent No.: US 10,447,297 B1
(45) Date of Patent: Oct. 15, 2019

(54) ELECTRONIC DEVICE AND METHOD FOR COMPRESSING SAMPLED DATA

(71) Applicant: Honeywell Federal Manufacturing & Technologies, LLC, Kansas City, MO (US)

(72) Inventors: Michael Tohlen, Kansas City, MO (US); Derek Welty, Kansas City, MO (US); Mitchell Morrow, Kansas City, MO (US)

(73) Assignee: Honeywell Federal Manufacturing & Technologies, LLC, Kansas City, MO (US)

( * ) Notice: Subject to any disclaimer, the term of this patent is extended or adjusted under 35 U.S.C. 154(b) by 0 days.

(21) Appl. No.: 16/150,355

(22) Filed: Oct. 3, 2018

(51) Int. Cl.
*H03M 7/30* (2006.01)
*G06F 3/06* (2006.01)

(52) U.S. Cl.
CPC ........ *H03M 7/6058* (2013.01); *G06F 3/0608* (2013.01); *G06F 3/0661* (2013.01); *G06F 3/0673* (2013.01)

(58) Field of Classification Search
CPC .. H03M 7/6058; G06F 3/0608; G06F 3/0673; G06F 3/0661

USPC .......................................................... 341/87
See application file for complete search history.

(56) References Cited

U.S. PATENT DOCUMENTS

| | | | |
|---|---|---|---|
| 4,214,125 A | 7/1980 | Mozer et al. | |
| 4,680,797 A | 7/1987 | Benke | |
| 5,623,935 A | 4/1997 | Faisandier | |
| 5,754,697 A | 5/1998 | Fu et al. | |
| 5,839,100 A | 11/1998 | Wegener | |
| 6,791,482 B2 * | 9/2004 | Koyanagi | H03M 1/661 341/61 |
| 7,088,276 B1 | 8/2006 | Wegener | |
| 2012/0239627 A1 * | 9/2012 | Nyuunoya | H03M 7/3059 707/679 |

* cited by examiner

*Primary Examiner* — Khai M Nguyen
(74) *Attorney, Agent, or Firm* — Hovey Williams LLP

(57) ABSTRACT

An electronic device for compressing sampled data comprises a memory element and a processing element. The memory element is configured to store sampled data points and sampled times. The processing element is in electronic communication with the memory element and is configured to receive a plurality of sampled data points, a slope for each sampled data point in succession, the slope being a value of a change between the sampled data point and its successive sampled data point, and store the sampled data point in the memory element when the slope changes in value from a previous sampled data point.

20 Claims, 7 Drawing Sheets

INPUT AMPLITUDE

| 0 | S0 |
|---|---|
| 1 | S1 |
| 2 | S2 |
| ⋮ | ⋮ |
| n-1 | Sn-1 |

INPUT TIME

| 0 | t0 |
|---|---|
| 1 | t1 |
| 2 | t2 |
| ⋮ | ⋮ |
| n-1 | tn-1 |

FIG. 5

DIFFERENCE

| 0 | \|S1 - S0\| |
|---|---|
| 1 | \|S2 - S1\| |
| 2 | \|S3 - S2\| |
| ⋮ | ⋮ |
| n-2 | \|Sn-1 - Sn-2\| |

FIG. 6

OUTPUT AMPLITUDE

| 0 | S0 |
|---|---|
| 1 | S1 |
| 2 | S4 |
| ⋮ | ⋮ |
| n-1 | S20 |

OUTPUT TIME

| 0 | t0 |
|---|---|
| 1 | t1 |
| 2 | t2 |
| ⋮ | ⋮ |
| n-1 | t20 |

FIG. 7

ELECTRONIC DEVICE AND METHOD FOR COMPRESSING SAMPLED DATA

STATEMENT REGARDING FEDERALLY-SPONSORED RESEARCH OR DEVELOPMENT

This invention was made with government support under Contract No.: DE-NA0000622 awarded by the Department of Energy. The government has certain rights in the invention.

BACKGROUND OF THE INVENTION

Field of the Invention

Embodiments of the current invention relate to electronic devices and methods for compressing sampled data.

Description of the Related Art

Capturing and recording a value of a signal or waveform at regular time intervals, a process known as "sampling", often results in large amounts of sampled data. Sampled data may be captured from, or come in the form of, audio signals, video signals, sensor data, and the like. Typically, it is desirable to compress, or reduce, the sampled data before storing or transmitting it so that the sampled data takes up less storage space, requires less communication bandwidth to transmit, or results in a shorter transmission time. Data compression techniques, such as aperture sampling, may reduce the sampled data by capturing significant changes in a signal or waveform's point-to-point amplitude. However, these techniques might not provide sufficient compression of the ever-increasing amount of media content generated by ubiquitous electronic devices and other sources. The result is a greater than necessary amount of storage space being consumed and increased requirements of bandwidth and transmission time.

SUMMARY OF THE INVENTION

Embodiments of the current invention solve the above-mentioned problems and provide a distinct advance in the art of compressing sampled data. In one embodiment, the current invention provides an electronic device configured to analyze a plurality of slopes, or first derivative, of the signal or waveform—resulting in an increase of the compression of sampled data. The electronic device broadly comprises a memory element and a processing element. The memory element is configured to store sampled data points and sampled times. The processing element is in electronic communication with the memory element and is configured to receive a plurality of sampled data points, a slope for each sampled data point in succession, the slope being a value of a change between the sampled data point and its successive sampled data point, and store the sampled data point in the memory element when the slope changes in value from a previous sampled data point.

In another embodiment, the current invention provides a electronic device for compressing sampled data. The electronic device broadly comprises a memory element and a processing element. The memory element is configured to store sampled data points and sampled times. The processing element is in electronic communication with the memory element and is configured to receive a plurality of sampled data points and a plurality of sampled times, each sampled data point associated with a successive one of the sampled times, calculate a plurality of differences, each difference being a magnitude of a change between successive adjacent pairs of sampled data points, calculate a plurality of difference changes, each difference change being a magnitude of a change between successive adjacent pairs of differences, compare each difference change to a threshold, and for each difference change that is greater than the threshold, store in the memory element one sampled data point associated with the difference change.

In yet another embodiment, the current invention provides a computer-implemented method for compressing sampled data. The method comprises receiving a plurality of sampled data points and a plurality of sampled times, each sampled data point associated with a successive one of the sampled times; calculating a plurality of differences, each difference being a magnitude of a change between successive adjacent pairs of sampled data points; calculating a plurality of difference changes, each difference change being a magnitude of a change between successive adjacent pairs of differences; comparing each difference change to a threshold; and for each difference change that is greater than the threshold, storing in the memory element one sampled data point associated with the difference change.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the current invention will be apparent from the following detailed description of the embodiments and the accompanying drawing figures.

BRIEF DESCRIPTION OF THE DRAWING FIGURES

Embodiments of the current invention are described in detail below with reference to the attached drawing figures, wherein.

Figure 2:
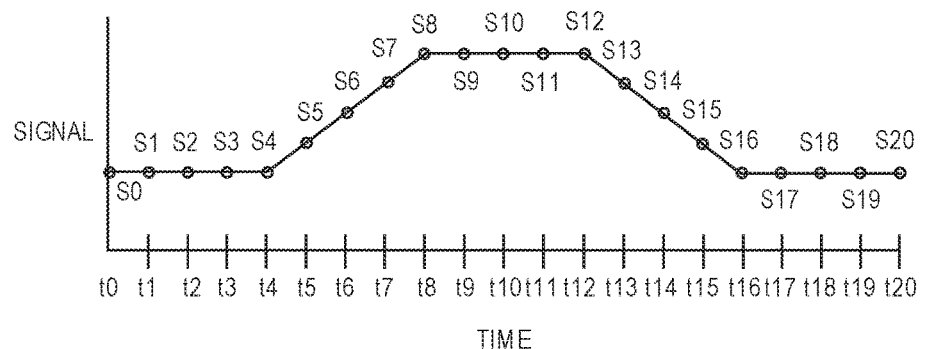
FIG. 2 is a plot of a signal vs. time, the plot including a plurality of sampled data points and sampled times.
Figure 4A:
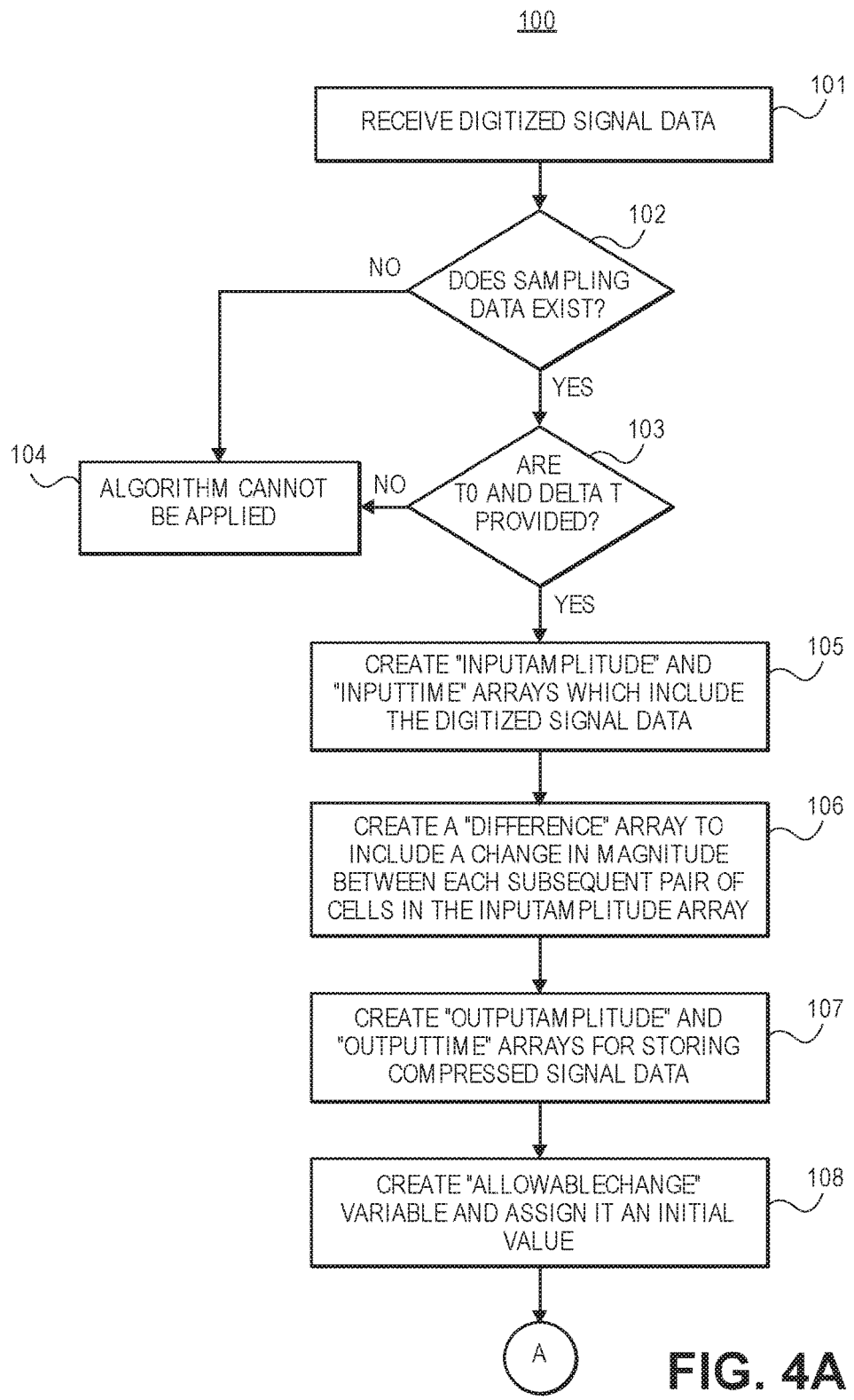
Figure 4B:
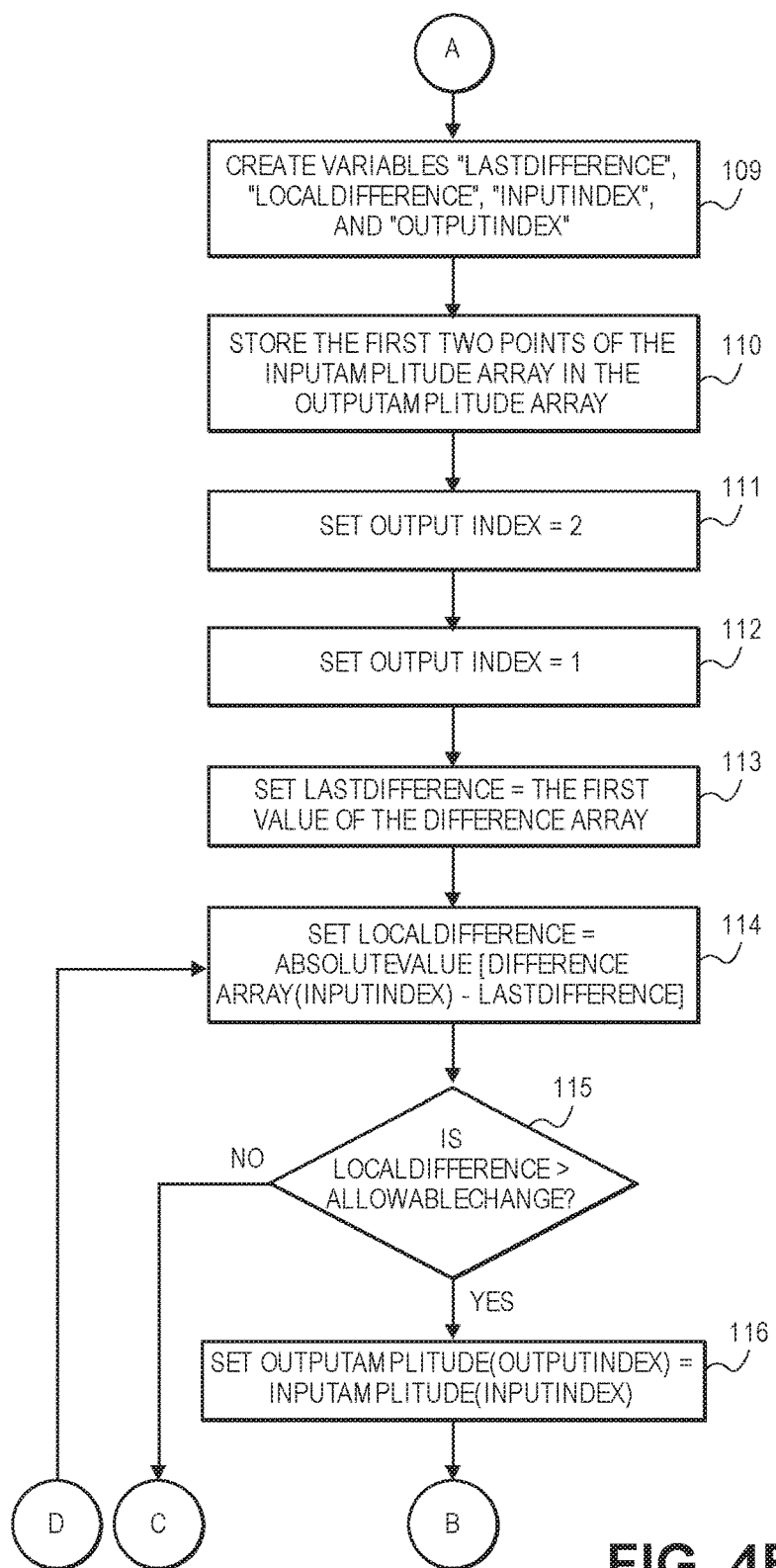
Figure 4C:
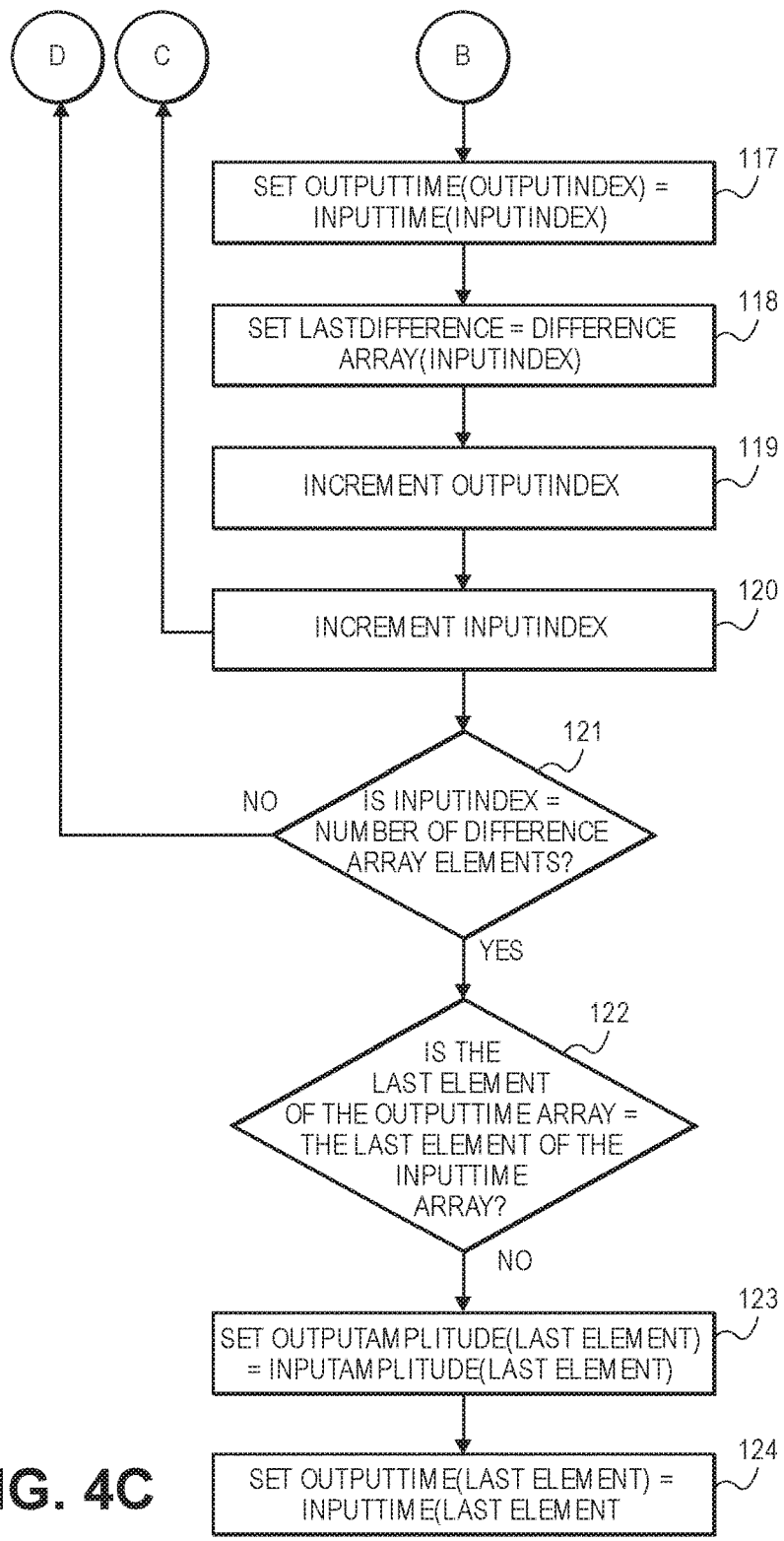
Figure 8:
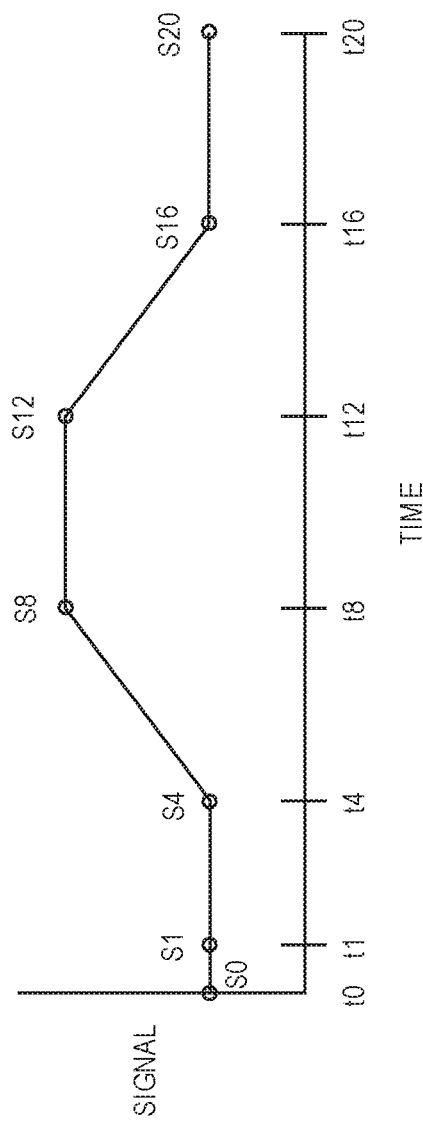
Figure 9:
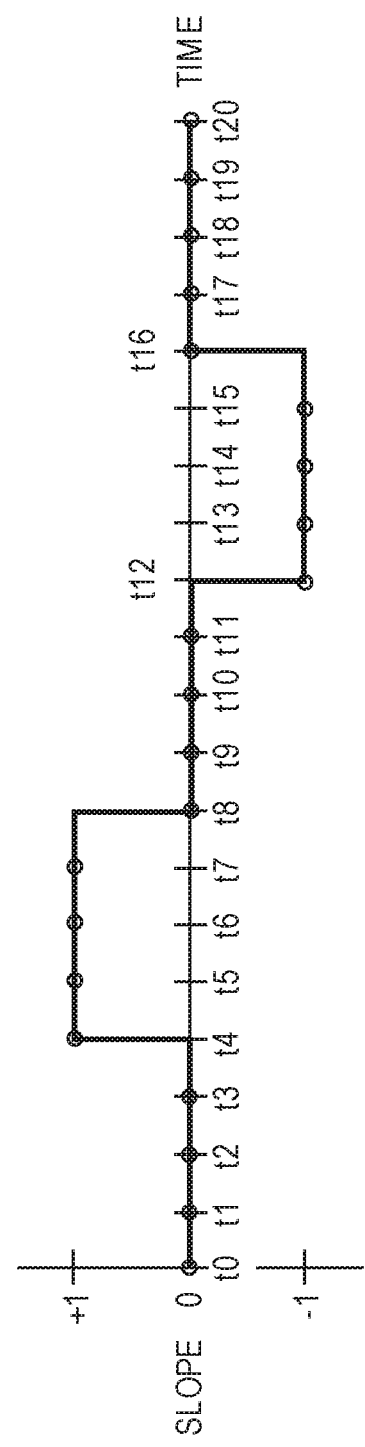

FIGS. 4A, 4B, and 4C depict a flow chart of an algorithm for compressing sampled data; and FIG. 5 is a depiction of an inputamplitude array, configured to store sampled data points, and an inputtime array, configured to store sampled times;

FIG. 6 is a depiction of a difference array, configured to store a plurality of differences, each difference being a magnitude of a change between successive adjacent pairs of sampled data points;

FIG. 7 is a depiction of an outputamplitude array, configured to store compressed data points, and an outputtime array, configured to store compressed times;

FIG. 8 is a plot of the signal vs. time of FIG. 2, depicting only the compressed data points and compressed times;

FIG. 9 is a plot of the slope vs. time for the waveform of FIG. 2; and

Figure 10:
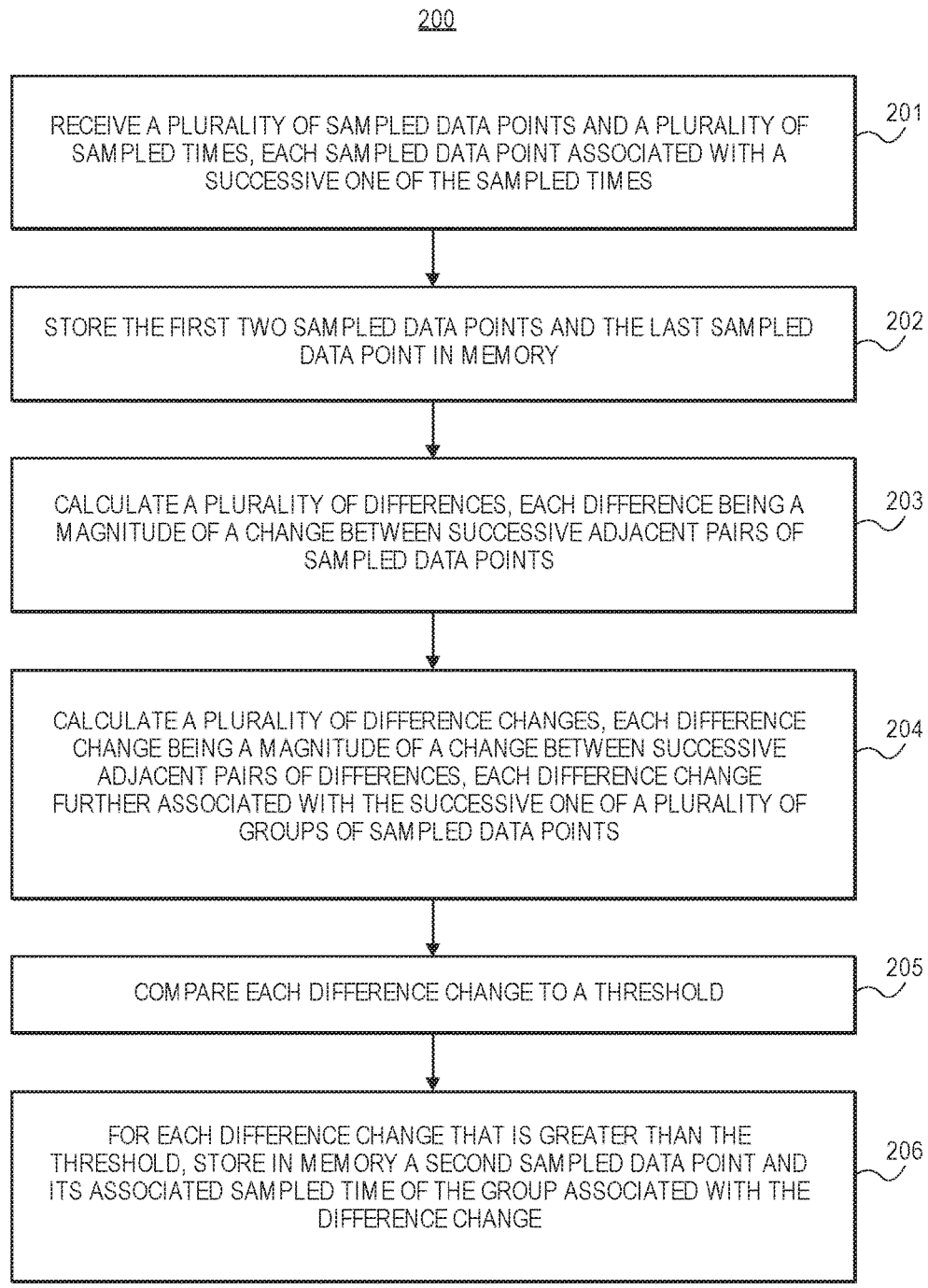

FIG. 10 is a listing of at least a portion of the steps of a method for compressing sampled data.

The drawing figures do not limit the current invention to the specific embodiments disclosed and described herein. The drawings are not necessarily to scale, emphasis instead being placed upon clearly illustrating the principles of the invention.

DETAILED DESCRIPTION OF THE EMBODIMENTS

The following detailed description of the invention references the accompanying drawings that illustrate specific embodiments in which the invention can be practiced. The embodiments are intended to describe aspects of the invention in sufficient detail to enable those skilled in the art to practice the invention. Other embodiments can be utilized and changes can be made without departing from the scope of the present invention. The following detailed description is, therefore, not to be taken in a limiting sense. The scope of the present invention is defined only by the appended claims, along with the full scope of equivalents to which such claims are entitled.

In this description, references to "one embodiment", "an embodiment", or "embodiments" mean that the feature or features being referred to are included in at least one embodiment of the technology. Separate references to "one embodiment", "an embodiment", or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the current technology can include a variety of combinations and/or integrations of the embodiments described herein.

Figure 1:
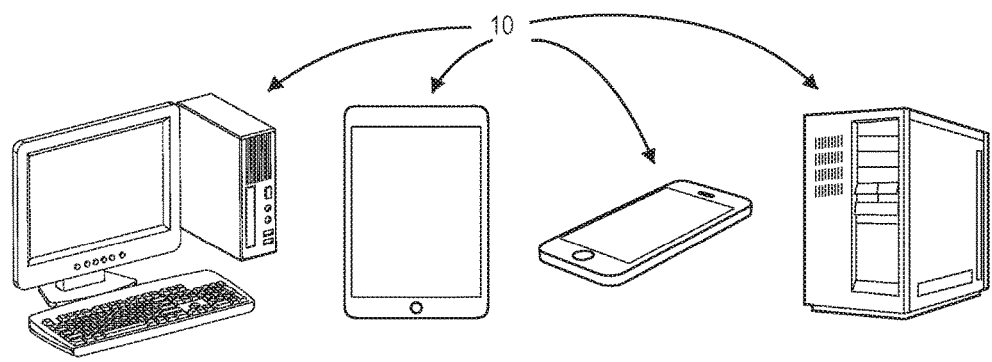
FIG. 1 is a perspective view of a plurality of electronic devices, each constructed in accordance with various embodiments of the current invention, each configured to perform compression of sampled data.

An electronic device 10 for compressing sampled data is shown constructed in accordance with various embodiments of the current invention in FIG. 1. In some instances, the electronic device 10 may be embodied by server computers, workstation computers, desktop computers, or the like which are able to receive a file of sampled data and perform compression thereon. In other instances, the electronic device 10 may be embodied by laptop computers, palmtop computers, notebook computers, tablets or tablet computers, smart phones, mobile phones, cellular phones, personal digital assistants (PDAs), smart watches or wearables, or the like which include components, such as cameras, microphones, sensors, and so forth, that are able to stream sampled data or generate a file of sampled data on which the device 10 can perform compression.

Sampling data may be illustrated in the plot of a signal, or waveform, versus time, as shown in FIG. 2. The signal may be the output of a camera, a microphone, a sensor, or the like and may represent moving or still image data, audio data, motion data, and so forth. Sampling the signal may involve capturing and recording a value of an amplitude of the signal at an instant in time, which creates a sample. The capturing and recording may occur repeatedly, typically at a constant frequency, known as the sampling rate or sampling frequency—thus, generating sampled data. In the example of FIG. 2, the samples, or sampled data points, are shown as a plurality of points, or dots, along the signal and are labeled $S_n$, where n is an index number ranging from 0 to 20. This range is merely exemplary. In practical situations, the range of samples may be orders of magnitude greater. Each sample is taken at a time point, labeled $t_n$, where n is the same index as is used for the samples. The sampled data may form an array with n elements having values $S_0$ to $S_{n-1}$.

Compressing the sampled data, in general, produces an output array of data, compressed data, that includes fewer elements than the array of sampled data. The compressed data (and the compression process) may be lossless, which means that the original signal, from which the sampled data was taken, can be reconstructed perfectly using linear interpolation. Alternatively, the compressed data (and the compression process) may be lossy, which means that the original signal cannot be reconstructed perfectly because some of the sampled data was lost or purposely discarded in an attempt to achieve further compression.

Figure 3:
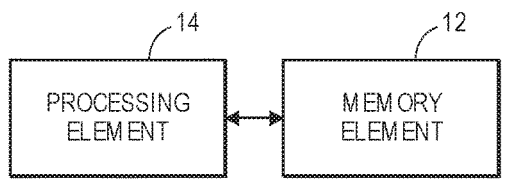
FIG. 3 is a schematic block diagram of various components of one electronic device.

The electronic device 10 may broadly comprise a memory element 12 and a processing element 14, as shown in FIG. 3. The electronic device 10 may further include components such as a display, a user interface including inputs such as a keyboard, a mouse, a touchscreen, or a microphone and outputs such as a speaker, a communication element allowing communication with other devices or systems, cameras, sensors, and the like which will not be discussed in detail.

The memory element 12 may be embodied by devices or components that store data in general, and digital or binary data in particular, and may include exemplary electronic hardware data storage devices or components such as read-only memory (ROM), programmable ROM, erasable programmable ROM, random-access memory (RAM) such as static RAM (SRAM) or dynamic RAM (DRAM), cache memory, hard disks, floppy disks, optical disks, flash memory, thumb drives, universal serial bus (USB) drives, or the like, or combinations thereof. In some embodiments, the memory element 12 may be embedded in, or packaged in the same package as, the processing element 14. The memory element 12 may include, or may constitute, a non-transitory "computer-readable storage medium". The memory element 12 may store the instructions, code, code statements, code segments, software, firmware, programs, applications, apps, services, daemons, or the like that are executed by the processing element 14. The memory element 12 may also store settings, data, documents, sound files, photographs, movies, images, databases, and the like. In various embodiments, the memory element 12 may receive and store sampled data.

The processing element 14 may include electronic hardware components such as processors, microprocessors (single-core or multi-core), microcontrollers, digital signal processors (DSPs), field-programmable gate arrays (FPGAs), analog and/or digital application-specific integrated circuits (ASICs), or the like, or combinations thereof. The processing element 14 may generally execute, process, or run instructions, code, code segments, code statements, software, firmware, programs, applications, apps, processes, services, daemons, or the like. The processing element 14 may also include hardware components such as finite-state machines, sequential and combinational logic, and other electronic circuits that can perform the functions necessary for the operation of the current invention. The processing element 14 may be in communication with the other electronic components through serial or parallel links that include universal busses, address busses, data busses, control lines, and the like.

The processing element 14 may be configured or programmed to perform the following functions or operations as a result of hardware, software, firmware, or combinations thereof. The processing element 14 may implement an algorithm 100 for compressing sampled data, as shown in the flowchart of FIGS. 4A, 4B, and 4C and explained as follows. Digitized signal data is received, as indicated in block 101. In some cases, the data may include just sampled values without any timing information, such as sampling rate or times, such as timestamps or time of day, when each sampled value was captured. In other cases, the digitized data may include sampled data values and timing data such as sampling rates or sampled data times. The digitized signal data is examined to determine the content of the data, as in decision blocks 102, 103. If the data does not include timing information, then the algorithm 100 cannot be applied, as indicated in block 104. Otherwise, if the data includes the proper information, then the data is separated into an "inputamplitude" array and an "inputtime" array, as indicated in block 105. The inputamplitude array includes values of all of the sampled data points, Sn, wherein each value is a real number representing an actual value of a physical quantity, such as electric voltage or electric current. There is one sampled data point per array element or cell, as shown in FIG. 5. The inputtime array includes all of the sampled times, tn, wherein the sampled time is a time value, such as a time of day timestamp or an offset time period from when the first sample was taken. There is one sampled time per array element or cell, as shown in FIG. 5.

As indicated in block 106, a "difference" array is created to include a change in magnitude between each subsequent pair of cells in the inputamplitude array (which are the sampled data points). The difference array may be notated as Dm or difference[m], wherein m ranges from 0 to the number of sampled data points minus one. As shown in FIG. 6, each cell of the difference array includes an absolute value of a (mathematical subtraction) difference between adjacent inputamplitude array cells. For example, within the first cell of the difference array, D0 or difference[0], is stored: |S1−S0|, which is also: |inputamplitude[1]−inputamplitude[0]|. Since the difference array includes the mathematical difference between adjacent inputamplitude array cells, the difference array will include one fewer cell than the inputamplitude array. In some embodiments, each cell of the difference array, difference[m], may be calculated as the absolute value of the difference between adjacent inputamplitude array cells divided by a difference between adjacent inputtime array cells. For example, the first cell of the difference array may be calculated as |(S1−S0)/(t1−t0)|.

Arrays "outputamplitude" and "outputtime" are created to store the compressed output data values for the amplitude and time, respectively, as indicated in block 107. The compressed output data values for the amplitude and time include the sampled data points and sampled data times, respectively, that are saved according to the rules of the algorithm 100, as discussed in more detail below.

An "allowablechange" variable is also created and assigned a value, as indicated in block 108. The allowablechange variable controls whether the algorithm 100 is lossless or lossy, and how much compression or loss occurs. For example, the data compression of the algorithm 100 is lossless when allowablechange=0. The data compression of the algorithm 100 is lossy when allowablechange >0. Generally, the greater the value of allowablechange, the more lossy the data compression. During implementation of the algorithm 100, the allowablechange variable acts as a constant and maintains its value throughout execution, but it may change value from the compression of one sampled data set to the next. In some embodiments, the user may be able to choose the value of the allowablechange variable in order to control the performance of the algorithm 100. Variables "lastdifference", "localdifference", "inputindex", and "outputindex" are created as indicated in block 109. lastdifference stores a value of the most recent cell from the difference array while the algorithm 100 sequentially retrieves the value of each cell of the difference array, as discussed in more detail below. localdifference stores a difference in magnitude between sequentially retrieved values of cells of the difference array and lastdifference. inputindex is a pointer that points to a current cell of the inputamplitude array. outputindex is pointer that points to a current cell of the outputamplitude array.

The values from the first two cells of the inputamplitude array are stored into the first two cells of the outputamplitude array, as indicated in block 110. This is a default step to store the first two sampled data points. outputindex is initialized to a value of 2 and inputindex is initialized to a value of 1, as indicated in blocks 111, 112. lastdifference is also initialized to have to the first value of the difference array, as indicated in block 113.

localdifference is set to be equal to an absolute value of a difference between the value of the difference array cell pointed to by inputindex and lastdifference, as indicated in block 114. The step of block 114 may mark the beginning of a loop of steps that are performed repeatedly. The number of times that the loop of steps may be performed is equal to the number of cells in the difference array minus 1.

The sampled data points may be considered to form a plurality of segments in sequential order, wherein each segment is a line between successive adjacent pairs of sampled data points. For example, a first segment may be a line between the first and second sampled data points, a second segment may be a line between the second and third sampled data points, and so forth. The slope of each segment may be a difference in its y-values divided by a difference in its x-values. Given that each segment has the same difference in its x-values, the slope then may be considered just the change in its y-values, which is the difference in sampled data points, or what is stored in each cell of the difference array. Since lastdifference stores the value of the most recent difference array cell, the step of block 114 calculates the magnitude of the change in slope from segment to segment, wherein the change is stored in localdifference. For example, the first time the step of block 114 is performed, inputindex=1 and lastdifference=D0. Thus, localdifference=|D1−D0|. In other words, the first time through, localdifference equals the magnitude of the change in slope from the first segment to the second segment.

localdifference is compared to allowablechange to determine if localdifference is greater than allowablechange, as indicated in decision block 115. The step of block 115 determines whether compression is performed, wherein compression is the discarding of the current sampled data point from being stored in the outputamplitude array, which is the compressed data set. The current sampled data point is the second point of the first segment, which is also the first point of the second segment in the comparison. If localdifference (the amount of change in the slope of the last two segments) is less than or equal to allowablechange, then compression is performed and the current sampled data point is not stored in the outputamplitude array. In other words, if the slope of the segments is not changing much at the current sampled data point, then there is no need to save the current sampled data point. And, the flow of the algorithm 100 is from block 115 to block 120.

On the other hand, if localdifference is greater than allowablechange, then compression is not performed and the current sampled data point is stored in the outputamplitude array. In other words, if the slope of the segments is changing significantly at the current sampled data point, then the current sampled data point should be saved. And, the algorithm 100 flows to block 116, in which the current sampled data point, inputamplitude[inputindex], is saved in the compressed data set, outputamplitude[outputindex]. To continue the example above regarding the first time the steps of blocks 115 and 116 are performed, localdifference, which is |D1−D0|, is compared with allowablechange. This comparison involves the sampled data points S0, S1, S2, and determines whether the slope of the segments formed by the points changes significantly at S1. If so, sampled data point S1 is saved. If not, then sampled data point S1 is not saved.

In addition, the current sampled time point, inputtime [inputindex], is saved in the compressed time set, outputtime [outputindex], as indicated in block 117. Furthermore, lastdifference is updated with the current value from the difference array, difference[inputindex], as indicated in block 118. outputindex is incremented, as indicated in block 119, since a sampled data point was saved in the compressed data set.

inputindex is incremented, as indicated in block 120. This step is performed either after the step of block 119 or after the step of block 115 if localdifference is not greater than allowablechange. Thus, inputindex is incremented whether or not compression was performed on the current sampled data point.

inputindex is checked to determine if it is equal to the number of difference array elements, as indicated in decision block 121. If not, then the loop of steps from blocks 114-120 continues, and the flow of the algorithm 100 returns to the step of block 114. If so, then the loop of steps from blocks 114-120 is complete, and the flow proceeds to the step of decision block 122, wherein the last element of the outputtime array is checked to determine if it is equal to the last element of the inputtime array. If so, then the algorithm 100 is complete. If not, then the last sampled data point, inputamplitude[last element], is stored in the compressed data set, outputamplitude[last element], as indicated in block 123. And, the last sampled time point, inputtime[last element], is stored in the compressed time set, outputtime[last element], as indicated in block 124. After the step of block 124, the algorithm 100 is complete.

As an example of its operation, the algorithm 100 was applied to a sampled data set created by sampling the signal shown in FIG. 2. The compressed data set and the compressed time set, which are the outputamplitude array and the outputtime array, respectively, are shown in FIG. 7. And, the compressed data points plotted on the original signal are shown in FIG. 8. As can be seen in FIG. 8, the first two sampled data points, S0, S1, were saved, as indicated in the step of block 110. The other sampled data points, S4, S8, S12, and S16, that were saved as compressed data were the data points at which the slope of the segments changed significantly, i.e., the slope change was greater than allowablechange. Finally, the last sampled data point was saved as compressed data, as indicated in the step of blocks 123, 124.

The processing element 14 may also be configured or programmed to perform the following functions or operations. The processing element 14 receives a plurality of sampled data points, e.g., S0–Sn−1, and a plurality of sampled times, e.g., t0–tn−1. Each sampled time is associated with a successive sampled data point. The processing element 14 calculates a slope, which may also be considered a first derivative, for each of the sampled data points in succession, wherein the slope is a value of change between the sampled data point and its successive sampled data point. For example, a slope for the first sampled data point, S0, is calculated as the second sampled data point, S1, minus the first sampled data point, S0: (S1−S0), i.e., for sampled data points that were sampled at a constant sampling frequency.

A plot of the slope of the exemplary waveform of FIG. 2 versus time is shown in FIG. 9. In general, or for sampled data points that were sampled with a variable sampling frequency, a slope for the first sampled data point, S0, is calculated as a difference between a value of the successive sampled data point, S1, and a value of a current sampled data point, S0, divided by a difference between a value of the sampled time, t1, associated with the successive sampled data point, S1, and a value of the sampled time, t0, associated with the current sampled data point, S0: (S1−S0)/(t1−t0). The processing element 14 tracks, or stores, at least temporarily, the currently-calculated slope and the previously-calculated slope. For example, when calculating the slope for the second (current) sampled data point, S1, the processing element 14 also has stored and has access to the slope calculated for the first (previous) sampled data point, S0. The processing element 14 may also calculate a change in the slope as a current slope minus a previous slope, or a difference between the two slopes. When the slope changes from the previous-sampled data point to the current-sampled data point—meaning that the difference between the two slopes is not zero—processing element 14 stores the current-sampled data point in the memory element 12. The processing element 14 may also store the sampled time associated with the current-sampled data point.

The processing element 14 continues the process of calculating a slope for each sampled data point and calculating a difference between the current slope and the previous slope. When the difference is not zero, the processing element 14 stores the current-sampled data point. In other words, wherever the slope changes value, the data point at which the change occurs is stored. From the plot of the slope in FIG. 9, it is seen that the slope changes value at the data points at the following times: t4, t8, t12, and t16. So, the data points at those times are stored in the memory element 12. When the processing element 14 comes to the last sampled data point, it does not perform the calculations, but instead simply stores the last sampled data point and its sampled time. In various embodiments, the processing element 14 may store the first two sampled data points and their associated sampled times automatically.

FIG. 10 depicts a listing of at least a portion of the steps of an exemplary computer-implemented method 200 for compressing sampled data. The steps may be performed in the order shown in FIG. 10, or they may be performed in a different order. Furthermore, some steps may be performed concurrently as opposed to sequentially. In addition, some steps may be optional or may not be performed. The steps may be performed by the processing element 14 of the electronic device 10 via hardware, software, firmware, or combinations thereof. Furthermore, the steps may be implemented as instructions, code, code segments, code statements, a program, an application, an app, a process, a service, a daemon, or the like, and may be stored on a computer-readable storage medium, such as the memory element 12.

Referring to step 201, a plurality of sampled data points and a plurality of sampled times are received. Each sampled data point may be the result of capturing and recording a value of an amplitude of a signal at an instant in time, which is the associated sampled time. Exemplary sampled data points are shown in FIG. 2 and are labeled as S0-S20. Also shown are sampled data times, labeled as t0-t20, wherein t0 is associated with S0, t1 is associated with S1, and so forth. Typically, the sampled data point is a real number representing an actual value of a physical quantity, such as electric voltage or electric current. The sampled time may include a time stamp, such as time of day, an offset time period from when the first sampled data point was captured, or the like Referring to step 202, the first two sampled data points, S0, S1, and the last sampled data point, Sn−1, are stored in the memory element 12. The first two sampled data points and the last sampled data point may be ignored by the operations of the subsequent steps, and thus, may be stored by default. The first two and last sampled times are stored in the memory element 12 as well.

Referring to step 203, a plurality of differences is calculated, wherein each difference is a magnitude of a change between successive adjacent, or consecutive, pairs of sampled data points. Each difference, notated as Dm, wherein m ranges from 0 to the number of sampled data points minus one, may be calculated by subtracting one sampled data point from another sampled data point and determining an absolute value of the result. For example, a first difference, D0, may be calculated as: |S1−S0|. A second difference, D1, may be calculated as: |S2−S1|, and so forth.

Referring to step 204, a plurality of difference changes is calculated, wherein each difference change a magnitude of a change between successive adjacent, or consecutive, pairs of differences. Each difference change, notated as DCx, wherein x ranges from 0 to the number of differences minus one, may be calculated by subtracting one difference from another difference and determining an absolute value of the result. For example, a first difference change, DC0, may be calculated as: |D1−D0|. A second difference change, DC1, may be calculated as: |D2−D1|, and so forth. In addition, each difference change is associated with successive groups of sampled data points, with each group including three sampled data points. The three sampled data points are three consecutive sampled data points that are used to determine two consecutive differences. For example, the first difference, D0, is determined from S1 and S0, while the second difference, D1, is determined from S2 and S1. Thus, the three consecutive data points are S0, S1, and S2. Since the first difference change, DC0, is determined from D1 and D0, the first difference change is associated with the group of sampled data points comprising S0, S1, and S2. Following the same reasoning, the second difference change, DC1, is associated with the group of sampled data points comprising S1, S2, and S3, and so forth.

The group of three consecutive sampled data points associated with each difference change is also the three points that form the first and second segments of the setup and comparison of blocks 114 and 115 of the algorithm 100 discussed above. Furthermore, the difference change is the same value and calculated in a similar way as the magnitude of the change of slope from the first segment to the second segment.

Referring to step 205, each difference change is compared to a threshold. The threshold controls whether the compression of the sampled data is lossless or lossy, and how much compression or loss occurs. For example, the data compression is lossless when the threshold=0. The data compression is lossy when the threshold >0. Generally, the greater the value of the threshold, the more lossy the data compression.

Referring to step 206, for each difference change that is greater than the threshold, a second sampled data point of the group associated with the difference change is stored in the memory element 12. The sampled time associated with the sampled data point is also stored in the memory element 12. As discussed above for step 204, the group of sampled data points associated with each difference change includes three consecutive sampled data points. The second sampled data point is the middle of the three, or the second ordinal point. For example, the first difference change, DC0, includes sampled data points S0, S1, and S2. The second sampled data point is S1. The second difference change, DC1, includes sampled data points comprising S1, S2, and S3. The second sampled data point is S2, and so forth.

The second sampled data point is also the current sampled data point discussed above with reference to blocks 115 and 116 of the algorithm 100, wherein the determination is made as to whether the change in slope between the first and second segments (localdifference) is greater than the threshold (allowablechange). If so, then the current sampled data point is saved. If not, then the current sampled data point is discarded. Like the current sampled data point of the algorithm 100, the second sampled data point of the method 200 is the point under consideration when the determination is made as to whether data compression is performed and the point is discarded or data compression is not performed and the data point is saved. Thus, all of the second sampled data points that are stored in the memory element 12 form the compressed data set.

Although the invention has been described with reference to the embodiments illustrated in the attached drawing figures, it is noted that equivalents may be employed and substitutions made herein without departing from the scope of the invention as recited in the claims.

Having thus described various embodiments of the invention, what is claimed as new and desired to be protected by Letters Patent includes the following:

1. An electronic device for compressing sampled data, the electronic device comprising:
   a memory element configured to store sampled data points and sampled times; and
   a processing element in electronic communication with the memory element, the processing element configured to
   receive a plurality of sampled data points,
   calculate a slope for each sampled data point in succession, the slope being a value of a change between the sampled data point and its successive sampled data point, and
   store the sampled data point in the memory element when the slope changes in value from a previous sampled data point.

2. The electronic device of claim 1, wherein the processing element is further configured to store the sampled time that is associated with the sampled data point in the memory element when the slope changes in value from the previous sampled data point.

3. The electronic device of claim 1, wherein the processing element is further configured to calculate the slope as a successive sampled data point minus a current sampled data point.

4. The electronic device of claim 1, wherein the processing element is further configured to
   receive a plurality of sampled times, each sampled data point associated with a successive one of the sampled times, and
   calculate the slope as a difference between a value of the successive sampled data point and a value of a current sampled data point divided by a difference between a value of the sampled time associated with the successive sampled data point and a value of the sampled time associated with the current sampled data point.

5. The electronic device of claim 1, wherein the processing element is further configured to calculate a slope change as a difference between a slope associated with a current sampled data point and a slope associated with a previous sampled data point, and store the current sampled data point in the memory element when the slope change is not zero.

6. The electronic device of claim 1, wherein the processing element is further configured to store a first and a second sampled data point with their associated sampled times and a last sampled data point along with its associated sampled time.

7. An electronic device for compressing sampled data, the electronic device comprising:

a memory element configured to store sampled data points and sampled times; and a processing element in electronic communication with the memory element, the processing element configured to receive a plurality of sampled data points, calculate a plurality of differences, each difference being a magnitude of a change between successive adjacent pairs of sampled data points, calculate a plurality of difference changes, each difference change being a magnitude of a change between successive adjacent pairs of differences, compare each difference change to a threshold, and for each difference change that is greater than the threshold, store in the memory element one sampled data point associated with the difference change.

8. The electronic device of claim 7, wherein the processing element is further configured to receive a plurality of sampled times, each sampled data point associated with a successive one of the sampled times, and store the first two sampled data points and the last sampled data point, along with the respective associated sampled times, in the memory element.

9. The electronic device of claim 7, wherein the processing element is further configured to calculate each difference as an absolute value of a first sampled data point minus a second, adjacent sampled data point.

10. The electronic device of claim 7, wherein the processing element is further configured to calculate each difference change as an absolute value of a first difference minus a second, adjacent difference.

11. The electronic device of claim 7, wherein the processing element is further configured to receive a plurality of sampled times, each sampled data point associated with a successive one of the sampled times, and for each difference change that is greater than the threshold, store in the memory element the sampled time that is associated with the one sampled data point.

12. The electronic device of claim 7, wherein each difference change is associated with a successive one of a plurality of groups of sampled data points, with each group including three consecutive sampled data points which form successive adjacent pairs of sampled data points.

13. The electronic device of claim 12, wherein the one sampled data point stored in the memory element for each difference change that is greater than the threshold is a second of the three consecutive sampled data points of the group associated with the difference change.

14. A computer-implemented method for compressing sampled data, the method comprising:

receiving a plurality of sampled data points and a plurality of sampled times, each sampled data point associated with a successive one of the sampled times;

calculating a plurality of differences, each difference being a magnitude of a change between successive adjacent pairs of sampled data points;

calculating a plurality of difference changes, each difference change being a magnitude of a change between successive adjacent pairs of differences;

comparing each difference change to a threshold; and for each difference change that is greater than the threshold, storing in the memory element one sampled data point associated with the difference change.

15. The computer-implemented method of claim 14, further comprising storing the first two sampled data points and the last sampled data point, along with the respective associated sampled times, in the memory element.

16. The computer-implemented method of claim 14, further comprising calculating each difference as an absolute value of a first sampled data point minus a second, adjacent sampled data point.

17. The computer-implemented method of claim 14, further comprising calculating each difference change as an absolute value of a first difference minus a second, adjacent difference.

18. The computer-implemented method of claim 14, further comprising storing in the memory element the sampled time that is associated with the one sampled data point for each difference change that is greater than the threshold.

19. The computer-implemented method of claim 14, wherein each difference change is associated with a successive one of a plurality of groups of sampled data points, with each group including three consecutive sampled data points which form successive adjacent pairs of sampled data points.

20. The computer-implemented method of claim 19, wherein the one sampled data point stored in the memory element for each difference change that is greater than the threshold is a second of the three consecutive sampled data points of the group associated with the difference change.

* * * * *